United States Patent [19]

Larson et al.

[11] Patent Number: 4,872,010
[45] Date of Patent: Oct. 3, 1989

[54] ANALOG-TO-DIGITAL CONVERTER MADE WITH FOCUSED ION BEAM TECHNOLOGY

[75] Inventors: Lawrence E. Larson, Los Angeles; Joseph F. Jensen, Malibu; Robert H. Walden, Westlake Village; Adele E. Schmitz, Newbury Park, all of Calif.

[73] Assignee: Hughes Aircraft Company, Los Angeles, Calif.

[21] Appl. No.: 153,750

[22] Filed: Feb. 8, 1988

[51] Int. Cl.[4] .............................................. H03M 1/18
[52] U.S. Cl. .................................. 341/134; 341/136; 357/23.7
[58] Field of Search ................... 341/133, 134, 136; 357/23.7, 23.12, 23.14

[56] References Cited

U.S. PATENT DOCUMENTS 4,212,684  7/1980  Brower ........................... 357/23.12
4,420,743  12/1983  Upadhyayula ..................... 341/136

FOREIGN PATENT DOCUMENTS 2021346  11/1979  United Kingdom .

OTHER PUBLICATIONS

Solid State Devices, Proceedings of the 6th Conf. on Solid State Devices, Tokyo, 1974, Supplement to the Journal of the Japan Society of Applied Physics, vol. 44, 1975, T. Yamaguchi et al.: "Investigations of Continuously Variable Threshold Voltage Devices (CVTD)", pp. 233–242, see abstr.; p. 235, col. 2, line 34–p. 236, col. 1, line 2; p. 239, col. 2, line 26–p. 240, col. 2, line 11; FIG. 8a.

IEEE Trans. on Elect. Devices, vol. ED-22, No. 5, May 1975, T. Yamaguchi, pp. 295–297.

Electronic Design, vol. 36, No. 16, Jul. 14, 1988 (Hasbrouck Heights, N.J., US), p. 34.

Primary Examiner—William M. Shoop, Jr.
Assistant Examiner—Gary J. Romano
Attorney, Agent, or Firm—Wanda K. Denson-Low

[57] ABSTRACT

An analog-to-digital converter 10 employs a series of comparators 12, 14, 16 and 18. Each comparator includes at least one inverter consisting of a CMOS transistor pair including a P-channel transistor 22 and N-channel transistor 24. The threshold levels of the transistors 22, 24 are modified using focused ion beam implantation techniques to provide the comparators with monotonically increasing transistion levels.

8 Claims, 7 Drawing Sheets

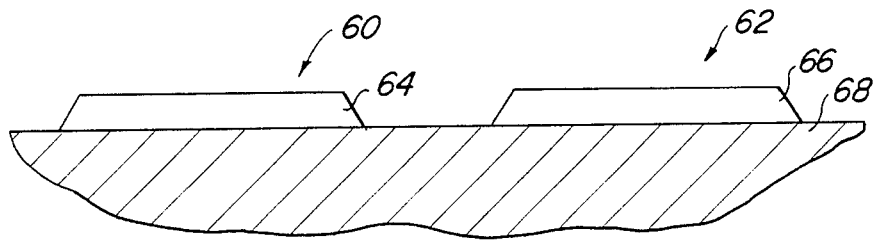
_Fig-7A_
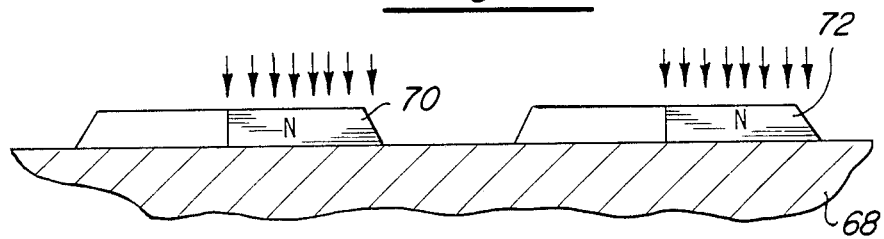
_Fig-7B_
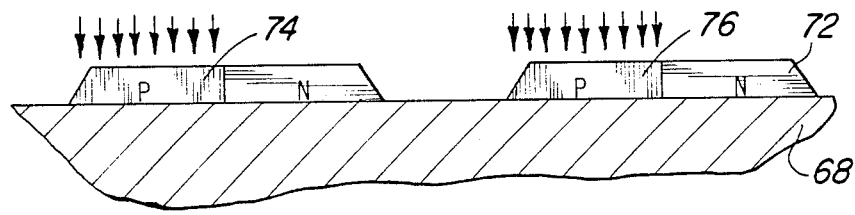
_Fig-7C_
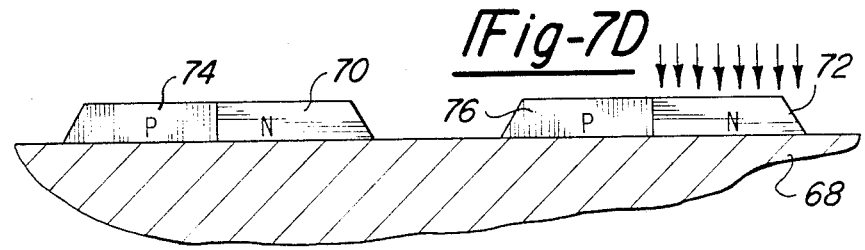
_Fig-7D_

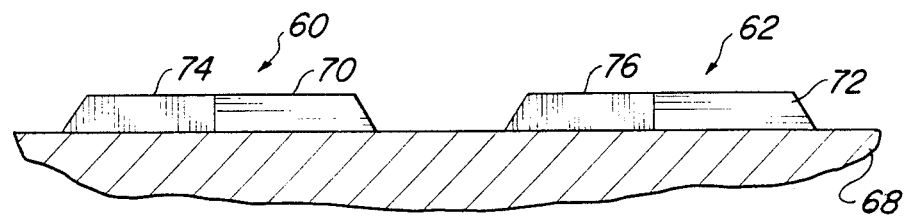
Fig-7I
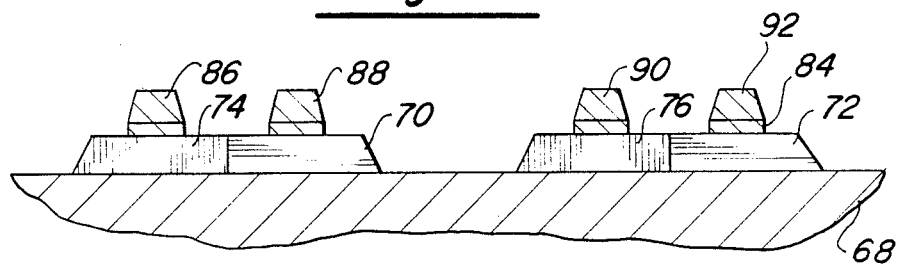
Fig-7J
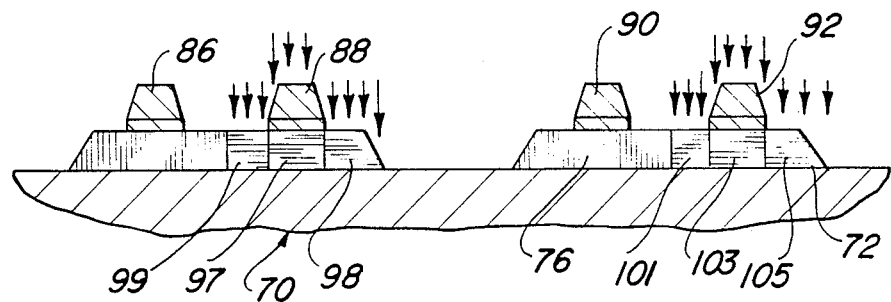
Fig-7K1
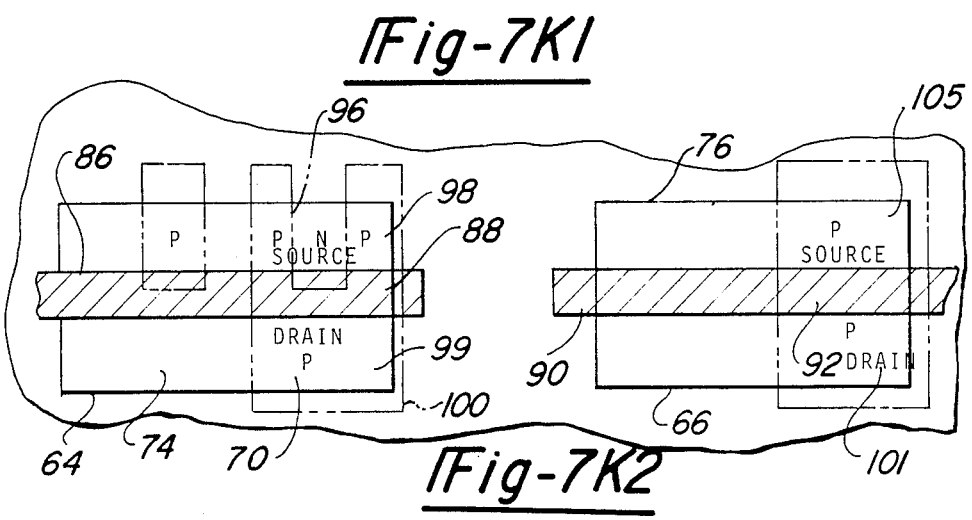
Fig-7K2

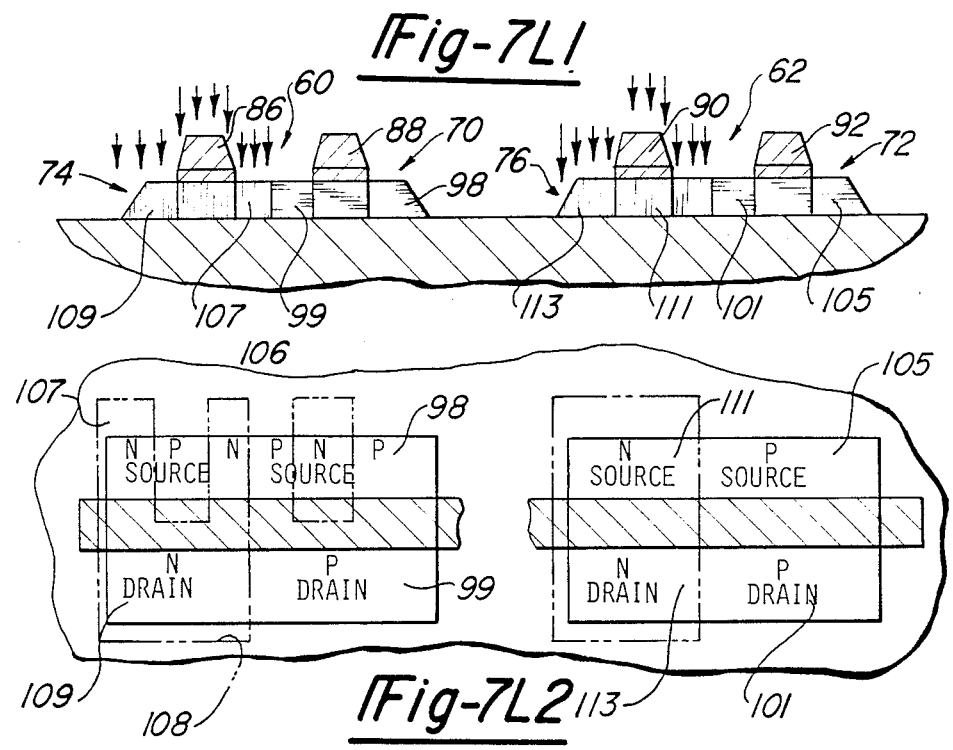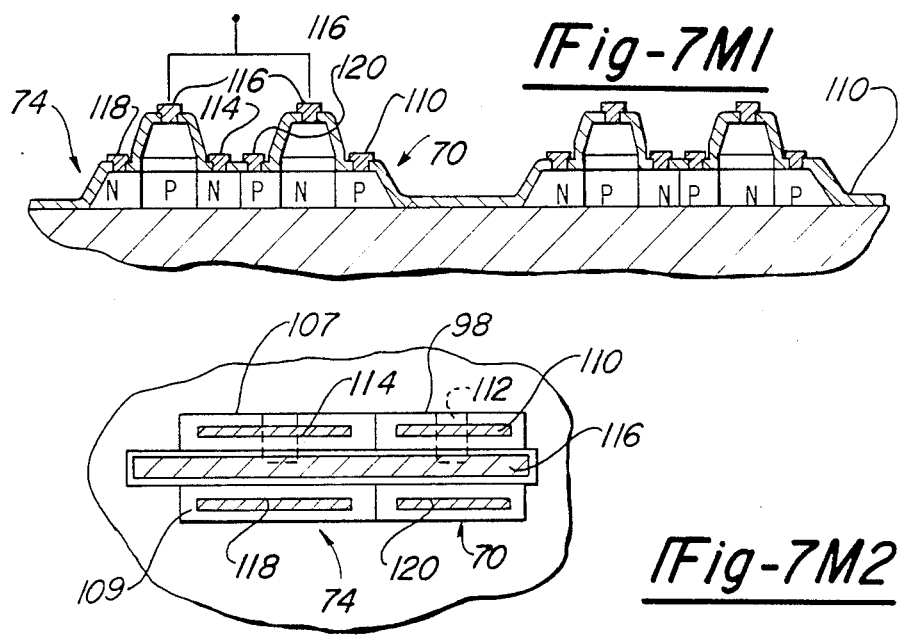

ANALOG-TO-DIGITAL CONVERTER MADE WITH FOCUSED ION BEAM TECHNOLOGY

The U.S. Government has rights in this application pursuant to Contract No. N66001-86-C-0193 issued by the Department of the Navy.

BACKGROUND OF THE INVENTION

1. Technical Field

This invention relates to analog-to-digital converters and, more particularly, to techniques for making such converters using focused ion beam implantation techniques.

2. Discussion

Analog-to-digital (A/D) converters are widely used to convert an analog signal into a binary or digital signal. Many A/D converters are employed to interface high speed analog signals with ultra-fast digital signal processors. As the speed and level of integration of digital circuits increases, it becomes important to fabricate A/D converters and digital processing circuitry on the same semiconductor substrate. GaAs FET or Silicon complementary metal oxide semiconductor (CMOS) technology is especially attractive for this approach because of its suitability for both analog and digital applications. However, in order to be able to accomplish this, it is necessary to implement the A/D converter in such a way that it requires little area on the substrate and minimizes power dissipation, yet performs the conversion process at high speed.

High speed A/D converters are often realized using so-called "flash" type circuitry. As an example, a two-bit flash A/D converter of the prior art is shown in FIG. This converter generally includes a resistor string (R1-R4), four comparators and latches, and a decoder. In operation, the analog input voltage ($V_{in}$) is applied simultaneously to all comparators and compared to corresponding fractions of the reference voltage ($V_{ref}$). If the analog input voltage is greater than the fractional portion of the reference voltage at its input, the comparator output will be high; otherwise it will be low. The latches are typically implemented by flip flops, which amplify and store the output states of the comparators. The latched comparator output signals are then decoded to produce the digital outputs A1 and A0 which may be processed into binary coded decimal (BCD) format.

A CMOS comparator circuit, which can be used in the FIG. 1 embodiment, is shown in FIG. 2. During the half clock cycle when the clock voltage ($\phi$) is high, the fractional share of the reference voltage ($V_i$) is applied to the capacitor C and, at the same time, the inverter is auto zeroed, which eliminates its offset voltage. During the second half of the clock cycle, when $\phi$ is low, the analog input voltage ($V_{in}$) is applied to capacitor C and the resulting difference ($V_i - V_{in}$) is amplified by the inverter and provided to the input of the latch. The minimum clock period is largely determined by the length of time required for the comparator to achieve a change of state, or by the time required by auto zeroing. This period determines the maximum sampling rate of the converter.

Some of the disadvantages of the A/D converter shown in FIGS. 1 and 2 are that the circuit speed is significantly degraded by the necessity for auto zeroing the comparator once per clock period. In addition, the parasitic capacitance of capacitor C further degrades the achievable speed. Also, the resistor ladder requires excessive area and power dissipation.

Another example of a CMOS A/D converter is disclosed in the paper by Silburt et al., "A Novel Multiple Threshold MOSFET Structure for A/D and D/A Conversion", IEEE Journal of Solid State Circuits, vol. SC-19, No. 5, October 1984. In the disclosed implementation a string of inverters is used to perform the A/D conversion. Each inverter has a unique threshold voltage. However, the threshold voltage is adjusted by varying the bias voltage of each transistors' substrate. This is a somewhat cumbersome technique to implement and has other disadvantages. For example, the optimum substrate bias voltage is temperature dependent, and each transistor requires its own temperature compensated bias supply. The technique is not applicable to CMOS/SOS or GaAs technologies, which are inherently faster than typical CMOS processes.

SUMMARY OF THE INVENTION

Pursuant to the present invention, an analog-to-digital converter is implemented through the use of a plurality of comparators each with different transition levels defined by FET transistors with different threshold levels. The threshold levels are set by using focused ion beam (FIB) implantation techniques to implant impurities in the channel regions of the field effect transistors used in the comparators. By appropriately changing the concentration of the impurity levels in the transistor channel regions, each comparator will switch state at different amplitudes of the applied analog input signal.

Among the advantages of the present invention is that the A/D converter can be implemented on a small portion of the same semiconductor substrate as other digital circuits without sacrificing speed.

BRIEF DESCRIPTION OF THE DRAWINGS

The various advantages of the present invention will become apparent to those skilled in the art upon reading the following specification and by reference to the drawings in which.

DESCRIPTION OF THE PREFERRED EMBODIMENTS

Figure 1:
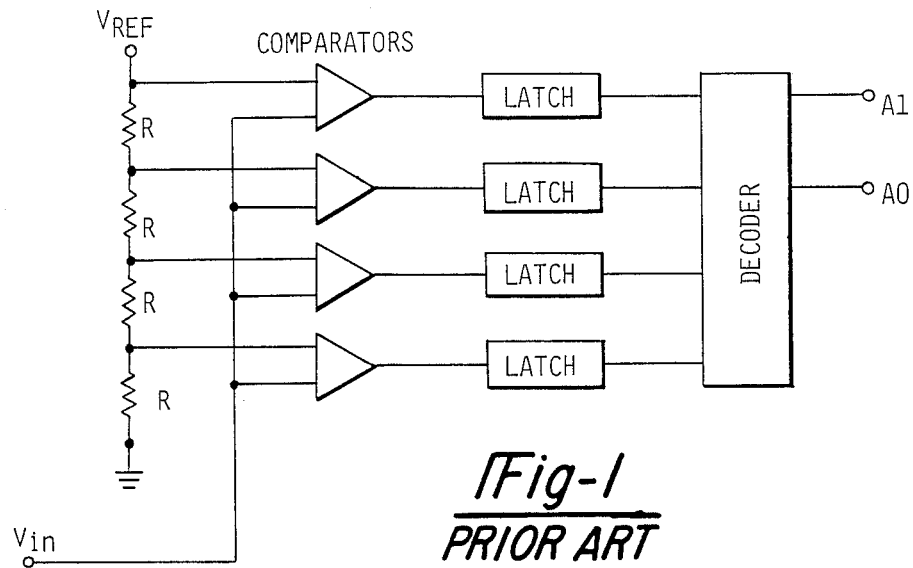
FIG. 1 is a block diagram of a prior art A/D converter.
Figure 2:
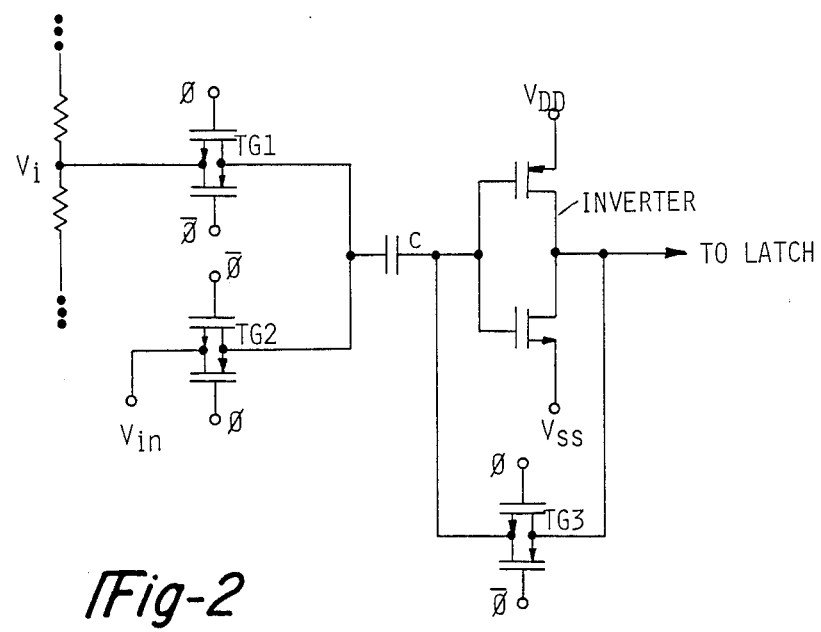
FIG. 2 is a circuit diagram of a comparator circuit which can be used in the prior art converter of FIG. 1.
Figure 3:
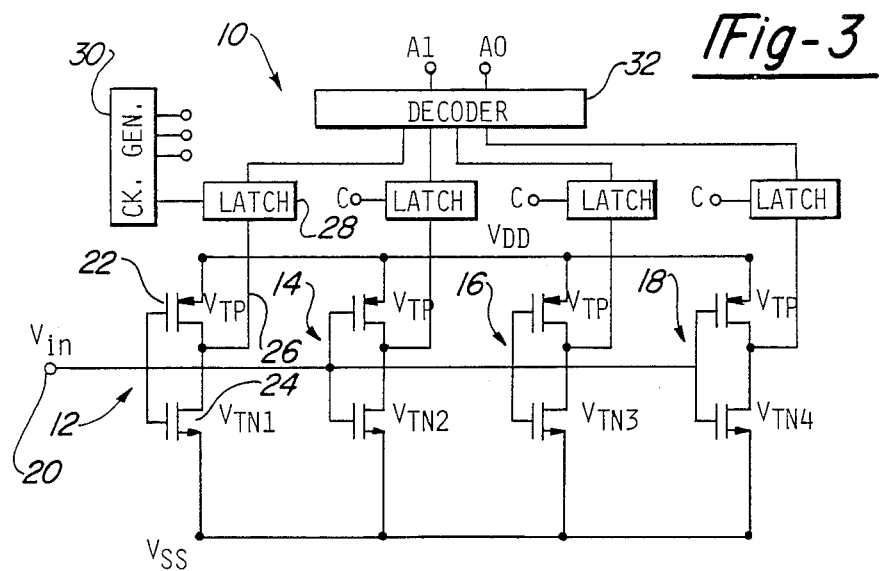
FIG. 3 is a schematic diagram of a CMOS A/D converter made in accordance with the teachings of one embodiment of the present invention.

FIG. 3 illustrates a two-bit A/D converter 10 made in accordance with one embodiment of this invention. A comparison of FIG. 3 with the designs shown in FIGS.

1 and 2 illustrates that the inventive implementation eliminates the need for the resistor string and switches or pass gates TG1 and TG2. The autozero switch TG3 of the other implementation has also been eliminated. According to the present invention the converter 10 includes a plurality of different comparators 12, 14, 16 and 18. Each comparator is coupled to receive the analog input voltage to be converted ($V_{in}$) on line 20. Each comparator is designed so that it will switch states when the amplitude of the analog input signal on line 20 exceeds its transition level. Monotonically increasing transition levels are provided for each comparator of converter 10 by appropriately modifying the threshold level of the gate regions of at least one of the field effect transistors (FET) in each comparator. The threshold levels are set by using ion beam implantation techniques to implant different impurity concentrations into the FET transistor gate regions.

In the embodiment of FIG. 3, each comparator utilizes at least one complimentary metal oxide semiconductor (CMOS) inverter employing two transistors 22 and 24. As is known in the art, each transistor includes its own drain, source, and gate regions. The gate region overlies a channel in the underlying semiconductor substrate. Transistor 22 is of a P-channel construction whereas transistor 24 is of an N-channel construction. As is known in the art, the threshold level of a CMOS inverter is essentially (defined by the threshold levels of the P-channel and N-channel transistors, as well as the dimensions of the channels themselves. Thus, each transistor 22 of the comparators 12, 14, 16 and 18 can be of identical design while only modifying the threshold levels of transistors 24 in each of the comparators. However, as will be discussed in more detail later herein, the threshold levels for both transistors are preferably modified using focused ion beam implantation technology so that each of the comparators 12, 14, 16 and 18 have monotonically increasingly different threshold levels with relatively small increments in order to provide for high A/D resolution. For purposes of this invention, the term "threshold level" means the voltage level that must be applied between the gate and source terminals of an FET transistor to allow current to flow between the source and drain. Likewise, for purposes of this invention, the term "transition voltage" means the input voltage required by the comparator to switch from one stable output state to another.

In the embodiment of FIG. 3, the analog input voltage is simultaneously applied to the gates of the CMOS pair of each comparator 12, 14, 16 and 18. If the threshold level of the particular inverter is exceeded by the analog input voltage, the N-channel transistor 24 will conduct thereby bringing the output line 26 to $V_{SS}$. This state will be amplified and stored in the latch 28 associated with each comparator. The contents of the latches 28 are then appropriately clocked via clock generator 30 into a suitable decoder 32. Decoder 32 serves to decode the number of latches which have been set into a binary output on lines A1, A0. It should be understood that while FIG. 3 is shown in connection with a two-bit A/D converter that the present invention has much broader applicability, and the resolution can be increased by including additional comparator and latch circuits in parallel.

Figure 4:
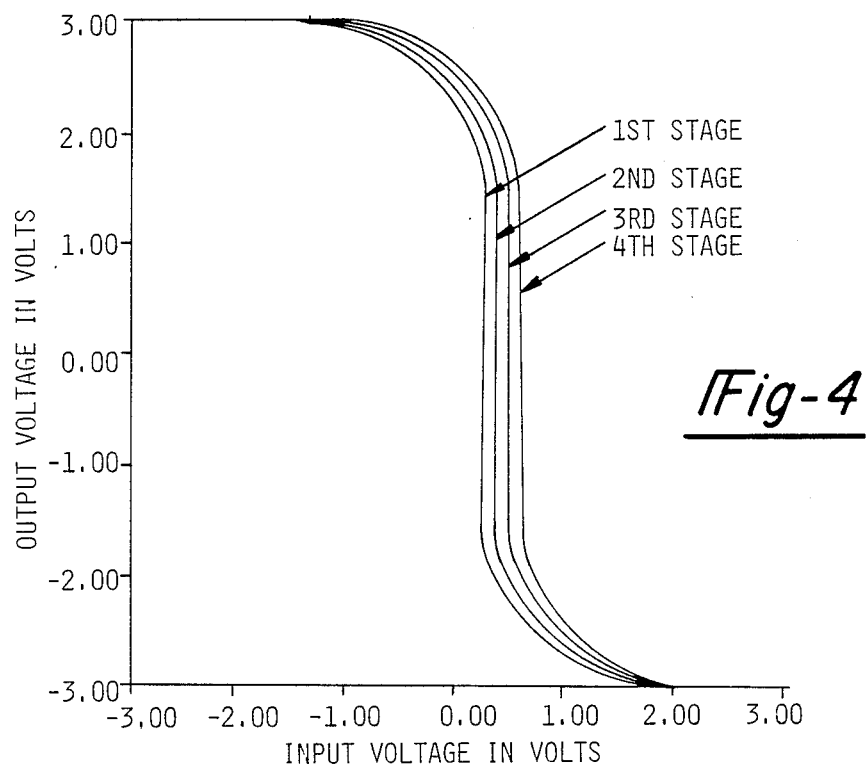
FIG. 4 is a graph showing DC transfer curves that may be obtained for the inverters of FIG. 3.
Figure 5:
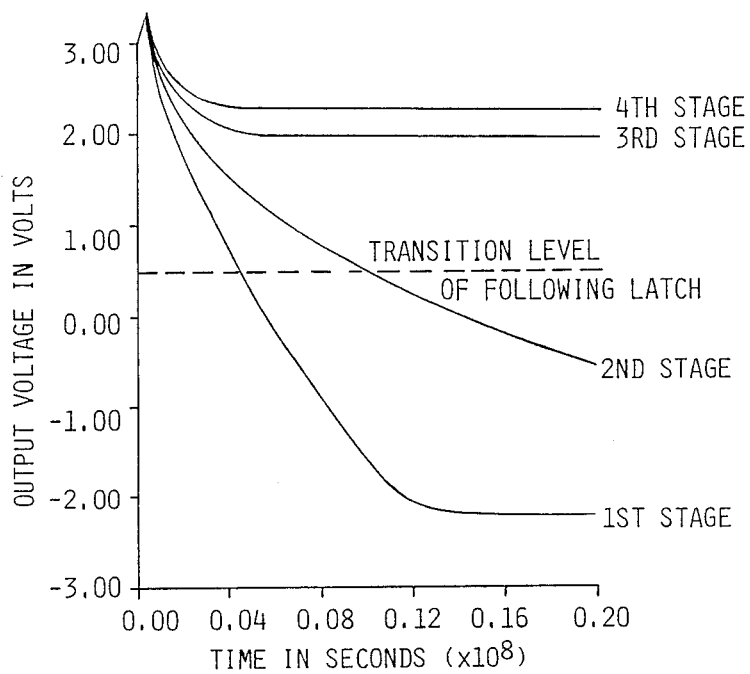
FIG. 5 is a graph illustrating output responses of the inverters of FIG. 3 that may be obtainable under certain conditions.

As shown in FIG. 4, it is expected that good DC transfer characteristics can be obtained from this construction, but that the response time can be limited in some circumstances where the analog input voltage is close to the comparator's transition level as illustrated for stage 2 in FIG. 5.

Figure 6:
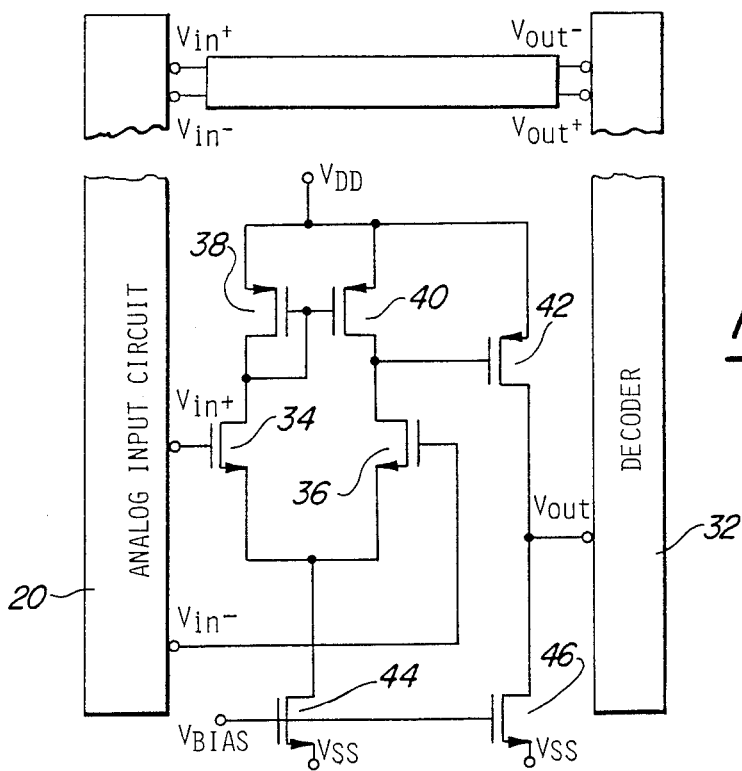
FIG. 6 is a schematic diagram of a second embodiment of an A/D converter made in accordance with the teachings of this invention.

FIG. 6 illustrates an alternative comparator circuit that can accept a differential input signal. This configuration employs a CMOS differential amplifier. The two input devices 34 and 36 each have a unique threshold voltage, and the difference between the two determines the comparator transition point. The comparator comprises two N-channel CMOS field effect transistors which constitute the input devices 34 and 36 and receive differential outputs from the analog input circuit 20 at respective gates thereof. The FETs 34 and 36 are connected to P-channel field effect transistors 38 and 40 in a differential amplifier configuration, with the drain of the FET 34 connected to the gates of the FETs 38 and 40. The output of the comparator, which corresponds to the difference between the two applied signals from the analog input circuit 20, is generated at the junction of the FETs 36 and 40 and applied to the decoder 32 via a P-channel field effect transistor 42. A bias voltage is applied to the comparator via N-channel field effect transistors 44 and 46. This differential configuration should minimize noise problems and is especially advantageous for high speed applications.

As is known in the art, it is desirable to have all of the digital devices on an integrated circuit chip to have the same threshold voltage. On the other hand, the inverters in the A/D converter of the present invention will have different threshold voltages. This can be accomplished by the method which will now be described.

FIG. 7 illustrates one possible sequence of processing steps for making a CMOS integrated circuit device 68 containing one analog CMOS device 60 for use in the comparator and one digital CMOS device 62 on the same semiconductor substrate. There are many other ways of accomplishing this. The analog device 60 may represent the transistors 22 and 24 of the CMOS inverters referred to above. The digital device 62 can be any of a wide variety of devices. For example, it can be part of one of the latches 28.

In FIG. 7(A), mesas 64 and 66 are formed in a silicon epitaxial layer or substrate that has previously been formed on a sapphire base 68. The processing of the P-channel transistors for the analog 60 and digital device 62 begins with simultaneously implanting suitable impurities to form N-type islands 70 and 72 in the mesas 64 and 66, respectively, as illustrated in FIG. 7(B). In this particular embodiment, phosphorous ions are implanted at 60 kev at a dose of $2 \times 10^{12}$, arsenic ions are implanted at 340 kev at a dose of $3.3 \times 10^{12}$ and arsenic ions are also implanted in a third implant at 550 kev at a dose of $7 \times 10^{12}$.

As shown in FIG. 7(C) N-channel device processing similarly utilizes a deep channel implant of suitable impurities to form P-type islands 74 and 76. To accomplish this, boron ions at 70 kev at a dose of $7 \times 10^{12}$ are utilized.

Figure 7E:
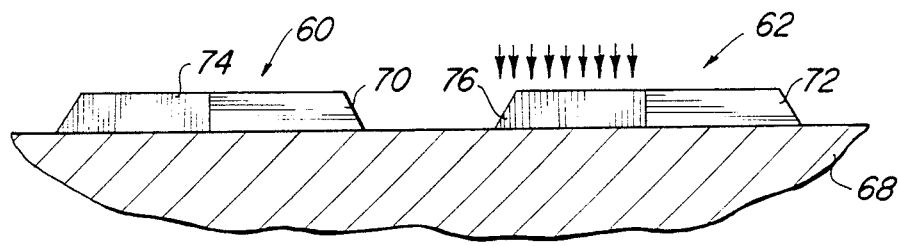
FIG. 7(A-M1) comprise simplified cross sectional and/or top plan views of sequential processing steps according to one embodiment of this invention for making an integrated circuit including both a CMOS analog device for an A/D converter and a CMOS digital device on the same substrate.

Turning to FIGS. 7(D) and 7(E), conventional implantation techniques are utilized to set the threshold level of both transistors in the digital device 62. This implant step is applied at the same time to all the digital devices on the integrated circuit substrate. In this embodiment, the P-channel device is implanted with a shallow implant of boron ions at 20 kev at a dose of $5.2 \times 10^{12}$. The threshold for the N-channel device is set by implanting boron ions at 20 kev at a dose of $1.8 \times 10^{12}$. Once again, all digital devices are implanted equally.

Figure 7F:
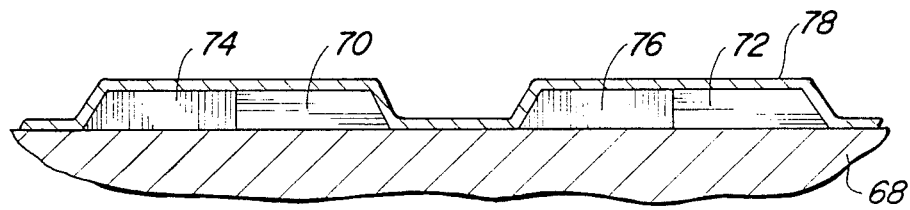
Figure 7G:
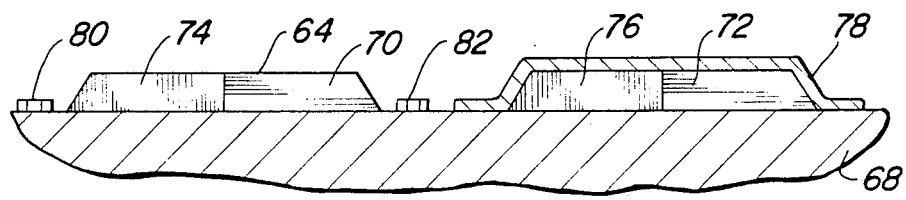

FIGS. 7(F) and 7(G) illustrate the formation of focused ion beam alignment targets 80, 82 in a deposited aluminum layer 78. These are used to individually implant the comparator devices. In FIG. 7(G), two such alignment targets 80, 82 are shown on either side of analog mesa 64. In practice, targets 80, 82 are generally cross shaped and there are typically more than two alignment targets employed. The targets should be made of conductive material and be located close to the target. This is because the focused ion beam apparatus requires the alignment targets to be relatively close to the areas to be implanted. Conventional photolithographic techniques are employed typically to etch the aluminum layer 78 to form the targets 80, 82.

Figure 7H:
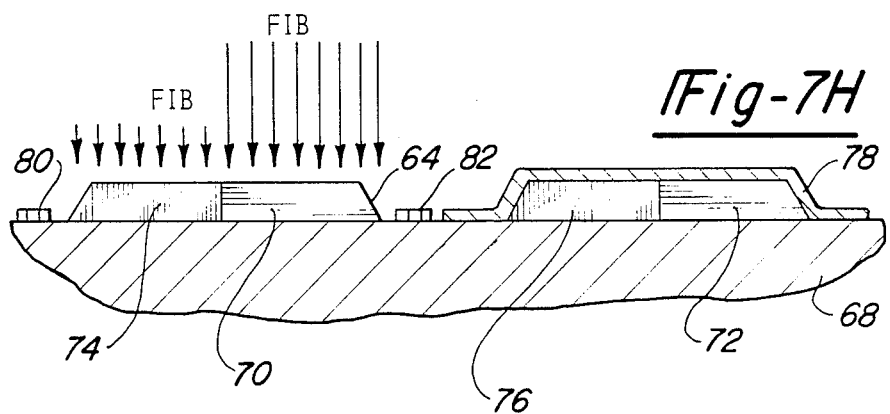

The next steps as illustrated in FIG. 7(H) is to employ a series of focused ion beam implantations in the P-channel 70 and N-channel portion 74 of the comparator device mesa 64. These implants uniquely define the P- and N-channel threshold, and hence the comparator transition voltage. As will appear, the P-channel transistor 70 is of the buried channel type. In the preferred embodiment, both of the N-channel and P-channel implants utilize boron ions at 20 kev using the focused ion beam. The follow Table I sets forth the dosage for the PMOS and NMOS transistor for 16 different comparators making up a four-bit A/D converter. The resultant threshold levels (Vt) are also listed in Table I.

TABLE I

| Comparator | NMOS Vt | PMOS Vt | NMOS Dose | PMOS Dose |
|---|---|---|---|---|
| 1 | 1.84 | 0.56 | 1.21E13 | 6.15E12 |
| 2 | 1.75 | 0.65 | 1.08E13 | 5.89E12 |
| 3 | 1.66 | 0.74 | 9.56E12 | 5.62E12 |
| 4 | 1.57 | 0.83 | 8.41E12 | 5.34E12 |
| 5 | 1.48 | 0.92 | 7.33E12 | 5.04E12 |
| 6 | 1.39 | 1.01 | 6.33E12 | 4.72E12 |
| 7 | 1.30 | 1.10 | 5.40E12 | 4.38E12 |
| 8 | 1.21 | 1.19 | 4.55E12 | 4.02E12 |
| 9 | 1.12 | 1.28 | 3.77E12 | 3.63E12 |
| 10 | 1.03 | 1.37 | 3.06E12 | 3.23E12 |
| 11 | 0.94 | 1.46 | 2.42E12 | 2.80E12 |
| 12 | 0.85 | 1.55 | 1.86E12 | 2.34E12 |
| 13 | 0.76 | 1.64 | 1.38E12 | 1.86E12 |
| 14 | 0.67 | 1.73 | 9.62E11 | 1.34E12 |
| 15 | 0.58 | 1.82 | 6.22E11 | 8.04E11 |
| 16 | 0.49 | 1.91 | 3.56E11 | 2.32E11 |

Briefly, the focused ion beam apparatus focuses a high energy beam of ionized impurity atoms onto a precise spot, with a precise diameter, on the integrated circuit substrate. By controlling the location, energy, and duration of the beam, the ionized impurity atoms can be arbitrarily added to the integrated circuit. More information on focused ion beam technology, and its application to integrate circuits, can be obtained by reading Lee et al., "Threshold Adjustments for Complementary Metal-Oxide-Semiconductor Optimization Using B and As focused Ion Beams", Applied Physics Lett. 48(10), Mar. 10, 1986, and Melngailis, J., "Focused Ion Beam Technology and Applications", J. Vac. Technol. B5, p. 469–495, Mar/Apr 1987, which are both hereby incorporated by reference.

Turning now to FIGS. 7(I) and 7(J), the aluminum layer 78 is stripped and the wafer is annealed. Then, the gate oxidation layer 84 is deposited. Thereafter, polysilicon gates 86, 88, 90 and 92 are formed over the transistors in the analog and digital devices.

The next general step is to form the source and drain regions in the P-channel transistors 70, 72 for the analog 60 and digital 62 devices, respectively. This process is illustrated in FIG. 7(K1) and 7(K2). FIG. 7(K2) is a top view of FIG. 7(K1) which has been rotated 180 degrees in a counterclockwise direction. Of particular note is the notch 96 formed in the source 98 of the P-channel transistor 70 in the analog device 60. Boron atoms are implanted through the masks shown in FIG. 7(K2) at 15 kev at a dose of $2 \times 10^{15}$. The notch 96 in mask 100 prevents the underlying region from being converted to P-type semiconductor material.

A similar source/drain implant for the N-channel transistors are illustrated in FIGS. 7(L1) and 7(L2). In this specific example, two arsenic ion implants of 150 kev with a dose of $2.5 \times 10^{15}$, and a second implant at 80 kev at a dose of $2.5 \times 10^{15}$ are utilized to define the source and drain regions in N-channel analog transistor 74 and source 111/drain 113 in N-channel digital transistor 76. As illustrated in FIG. 7(L2) a similar notch 106 is provided in the analog N-channel transistor mask 108. This provision similarly provides the advantages discussed above in connection with the P-channel transistor.

As illustrated in FIGS. 7(M1) and 7(M2) metalization is provided over an oxide layer 110 to form contacts for the various regions on the transistors. This can be accomplished using conventional processing techniques. As illustrated in FIG. 7(M2) the metalizing contact 110 for the source region of analog P-channel transistor 70 bridges the two P-type regions isolated by the N-type island 112 created by the mask notch 96. Similarly, metalization 114 for the N-channel transistor 74 bridges the similar island formed therein. Rounding out FIG. 7(M2) contact 116 is provided on top of the gates for both transistors to thereby short the gates together. Contacts 118 and 120 are provided for the drain regions of the two transistors. The remainder of the wafer can be processed using conventional techniques.

In summary, the present invention provides a number of advantages over conventional A/D converters. Extremely high speed and small size can be obtained while using technology that enables the devices to be operated at very low power and implemented on the same semiconductor substrate as other digital circuits. For example, sample rates exceeding one gigahertz at a power dissipation of 80 milliwatts can be expected. The use of focused ion beam technology facilitates the extremely small size of the transistors which can be in the sub-half micrometer range. In addition, the inventive design simplifies the A/D circuitry by eliminating the need for conventional resistor ladders and the like. Various other advantages will become apparent to those skilled in the art upon a study of the specification, drawings and following claims. For example, this A/D converter can be implemented in GaAs FET technology where a localized FIB implant uniquely sets the threshold voltage of the FETs, and hence the transition voltage of the inverters. In addition, the present invention enables the manufacturer to use many conventional processing steps while providing an improved device.

What is claimed is:
1. An analog-to-digital (A/D) converter comprising:
   a plurality of comparators having monotonically increasing transition levels, each comparator including at least one field effect transistor having drain, source and gate regions; the gate region overlying a channel in a semiconductor substrate;
   input means for providing an analog input signal simultaneously to each comparator;

the transistors in each comparator each having a different threshold level due to different concentrations of impurities implanted in the channel regions thereof by focused ion beam implantation techniques thereby defining said transition levels for each of the comparators; and decoder means coupled to outputs of each of the comparators for generating a digital output signal as a function of the comparator outputs;

each comparator including a least one complementary metal oxide (CMOS) inverter employing an N-channel and P-channel transistor;

each comparator comprising a pair of cross coupled inverters adapted to receive differential analog input signals.

2. The converter of claim 1 wherein outputs of each inverter are coupled directly to said decoder means.

3. An integrated circuit device comprising:
a digital device having at least one transistor with a given threshold level;
a plurality of analog device comparators having monotonically increasing transition levels, each comparator including at least one field effect transistor having drain, source and gate regions; the gate regions overlying a channel in said semiconductor substrate;
said channels in each transistor having different concentrations of impurities therein implanted by focused ion beam implantation techniques thereby defining monotonically different transition levels for the comparators;
said digital and analog devices being formed on the same semiconductor substrate.

4. The device of claim 3 which includes metallic alignment targets adjacent the transistors.

5. The device of claim 3 wherein each comparator includes at least one inverter having a CMOS transistor pair having a P-channel and N-channel transistor, the impurity concentration in the gate regions of the N-channel and P-channel transistors being different thereby providing each comparator with a different transition level.

6. The device of claim 5 wherein said digital device includes at least one CMOS transistor pair having an N-channel and P-channel transistor, with the impurity concentration in the channel regions of the N-channel transistors of the digital device being different than the N-channel transistors in the analog device, and wherein the channel regions in the P-channel transistors of the digital device have different impurity concentration levels than the P-channel transistors of the analog device.

7. The device of claim 6 wherein said analog and digital device are formed in silicon mesas supported by a sapphire base.

8. The device of claim 7 wherein the source region of at least one transistor in the analog device has two regions of one type impurity separated by an island of another type impurity which is connected to and is of the same type as the gate region.

* * * * *